United States Patent
Barnes et al.

(10) Patent No.: US 11,966,816 B2
(45) Date of Patent: Apr. 23, 2024

(54) GENERATING ERROR-RESISTANT QUANTUM CONTROL PULSES FROM GEOMETRICAL CURVES

(71) Applicant: VIRGINIA TECH INTELLECTUAL PROPERTIES, INC., Blacksburg, VA (US)

(72) Inventors: Edwin Barnes, Blacksburg, VA (US); Junkai Zeng, Blacksburg, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 93 days.

(21) Appl. No.: 17/765,875

(22) PCT Filed: Oct. 2, 2020

(86) PCT No.: PCT/US2020/053898
§ 371 (c)(1),
(2) Date: Apr. 1, 2022

(87) PCT Pub. No.: WO2021/067666
PCT Pub. Date: Apr. 8, 2021

(65) Prior Publication Data
US 2022/0374759 A1 Nov. 24, 2022

Related U.S. Application Data

(60) Provisional application No. 62/910,704, filed on Oct. 4, 2019.

(51) Int. Cl.
*G06N 10/60* (2022.01)
*H03K 17/92* (2006.01)

(52) U.S. Cl.
CPC ............ *G06N 10/60* (2022.01); *H03K 17/92* (2013.01)

(58) Field of Classification Search
CPC .................................................. G06N 10/60
USPC ......................................................... 327/527
See application file for complete search history.

(56) References Cited

U.S. PATENT DOCUMENTS

| | | | |
|---|---|---|---|
| 2013/0144156 A1* | 6/2013 | Boulant | G01R 33/4833 600/410 |
| 2018/0260732 A1* | 9/2018 | Bloom | G06N 10/40 |
| 2019/0049495 A1* | 2/2019 | Ofek | G06F 9/5027 |

OTHER PUBLICATIONS

Nalbach et al. "Magnus expansion for a chirped quantum two-level system", afXiv.org, Jun. 7, 2018.
(Continued)

*Primary Examiner* — Tomi Skibinski
(74) *Attorney, Agent, or Firm* — Perilla Knox & Hildebrandt LLP; Jason M. Perilla

(57) ABSTRACT

Aspects of generating error-resistant quantum control pulses from geometrical curves are described. In some embodiments, a closed space curve is parameterized for a target gate operation of a quantum computing device. The closed space curve corresponds to an evolution operator of a time-dependent Schrödinger equation associated with the target gate operation. A control field definition is identified for the target gate operation based at least in part on a geometrical analysis of the evolution operator of the time-dependent Schrödinger equation. The target gate operation is implemented for the quantum computing device based on the control field definition.

20 Claims, 6 Drawing Sheets

(56) References Cited

OTHER PUBLICATIONS

Khodjasteh et al. "Autmated Synthesis of Dynamically Corrected Quantum Gates", arXiv.org, Oct. 10, 2012.
Zeng et al. "Geometric formalism for constructing arbitrary single-qubit dynamically corrected gates", arXiv.org, Aug. 13, 2019.
International Search Report and Written Opinion dated Feb. 12, 2021.
Zeng et al., American Physical Society: Physical Review A 98, 012301 (2018), "Fastest pulses that implement dynamically corrected single-qubit phase gates", pp. 1-10, DOI: 10.1103/PhysRevA.98.012301.
Zeng et al., New Journal of Physics (20), "General solution to inhomogeneous dephasing and smooth pulse dynamical decoupling", Mar. 26, 2018, pp. 1-16, https://doi.org/10.1088/1367-2630/aaafe9.

\* cited by examiner

GENERATING ERROR-RESISTANT QUANTUM CONTROL PULSES FROM GEOMETRICAL CURVES

CROSS-REFERENCE TO RELATED APPLICATIONS

This application claims priority to, and the benefit of, the following related applications as the 35 U.S.C. § 371 national stage application of PCT Application No. PCT/US2002/053898, filed on Oct. 2, 2020, and entitled "GENERATING ERROR-RESISTANT QUANTUM CONTROL PULSES FROM GEOMETRICAL CURVES," which claims priority to and the benefit of U.S. Provisional Application No. 62/910,704, filed on Oct. 4, 2019, and entitled "METHOD TO GENERATE ERROR-RESISTANT QUANTUM CONTROL PULSES FROM GEOMETRICAL CURVES," the entire contents of all of the related applications is hereby incorporated herein by reference.

STATEMENT REGARDING FEDERALLY SPONSORED RESEARCH OR DEVELOPMENT

This invention was made with Government support under Grant No. W911NF-17-0297, awarded by the Army Research Office, as well as Grant No. N00014-17-2971, awarded by the Office of Naval Research. The Government has certain rights in the invention.

BACKGROUND

Implementing high-fidelity quantum control and reducing the effect of the coupling between a quantum system and its environment is a major challenge in developing quantum information technologies. In recent years, novel information technologies based on the principles of quantum mechanics have attracted growing interest from both academia and industry. For example, a quantum computer could enable us to tackle certain problems exponentially faster than an ordinary classical computer. For decades, people have been striving to overcome one of the main obstacles to realizing this and other proposed quantum technologies, namely, the decoherence caused by the coupling between a qubit and its noisy environment. Quantum error correcting codes can provide a way to surmount this problem; however, it remains a challenging task to raise the fidelity of qubit control above the error thresholds that determine when these codes work, although considerable experimental progress in recent years has brought this within reach in a number of physical systems.

Inspired by the Hahn spin-echo pulse introduced in the context of nuclear magnetic resonance, a wide range of techniques for implementing dynamical decoupling (DD), or more generally dynamically corrected gates have been developed in which deviations in a system's evolution caused by noise fluctuations or parameter inhomogeneities can be corrected by applying carefully designed driving pulses. Early work in DD mainly made use of instantaneous $\pi$ pulses ($\delta$ pulses) to flip the qubit state one or more times during the evolution such that the coupling to the environment is effectively undone. In the context of both DD and dynamically corrected gates, methods based on square pulses have also been developed.

However, in a real experiment, $\delta$-function or square waveforms can only be generated approximately by conventional technologies since they would require infinite power or arbitrarily fast electronics to realize exactly. This leads to an imperfect cancellation of errors and thus diminishes the performance of such dynamically corrected gate schemes, especially in systems that evolve on nanosecond timescales. Dynamically corrected gate schemes can be based on concatenating two or more noisy quantum operations that together produce the desired gate while their errors cancel up to some order. While some of these protocols can work for some pulse shapes used in the sequences, they leave open the possibility that more efficient methods based on the application of single, shaped pulses exist.

Searching for control pulse wave forms that implement dynamically corrected gates in a single shot is difficult (aside from a few simple cases such as $\delta$ or square pulses) because the time-dependent Schrödinger equation cannot be solved analytically in general, even for a two-level system. Numerical methods have been shown to be quite effective in many cases, but using these to find globally optimal wave forms that respect the constraints of a given physical system can be challenging, although there has been some recent progress in this direction. Analytical methods can be viewed as complementary to numerical techniques, where they can provide additional insight into why such techniques work or provide starting pulses that can speed up numerical algorithms. Analytical approaches that have been developed to circumvent the insolubility of the Schrödinger equation include methods based on Chebyshev polynomial approximations or reverse-engineering techniques, however, these approaches have not yet succeeded in providing pulses that implement arbitrary dynamically corrected gates, either because the methods only produce robust identity operations by design or because the constraint equations that determine the pulses are too difficult to solve.

SUMMARY

The present disclosure relates to generating error-resistant quantum control pulses from geometric curves. The geometric formalism described can be used in systems and methods to construct arbitrary dynamically corrected gates.

Some aspects of the present disclosure include a computer-implemented method. The method can include identifying an evolution operator associated with a target gate operation for a quantum computing device, determining a parameterization of a space curve using a Magnus expansion of the evolution operator, extracting a control field for a time-dependent Hamiltonian associated with the target gate operation based on a derivative of the Magnus expansion of the evolution operator, and implementing a dynamically corrected gate using the control field.

Additional aspects include a system for quantum computing. The system can include a computing device, and a memory storing executable instructions. The instructions can cause the computing device to identify an evolution operator associated with a target gate operation for a quantum computing device, parameterize a space curve based on a Magnus expansion of the evolution operator, extract a control field for a time-dependent Hamiltonian associated with the target gate operation based on a derivative of the Magnus expansion of the evolution operator, and implement the target gate operation for the quantum computing device using the control field.

Further aspects of the disclosure include a computer-implemented method. The method can include parameterizing a closed space curve for a target gate operation for a quantum computing device. The closed space curve corresponds to an evolution operator of a time-dependent Schrödinger equation associated with the target gate operation. The method further includes identifying a control field for the target gate operation using a geometrical analysis of the evolution operator of the time-dependent Schrödinger equation, and implementing the target gate operation for the quantum computing device using the control field.

BRIEF DESCRIPTION OF THE DRAWINGS

Many aspects of the present disclosure can be better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

The present disclosure relates to generating error-resistant quantum control pulses from geometric curves. Conventional technologies can only approximate δ-function or square waveforms since they would require infinite power or arbitrarily fast electronics to realize exactly. This leads to an imperfect cancellation of errors and thus diminishes the performance of such dynamically corrected gate schemes. However, the present disclosure includes mechanisms for geometric formalism that can be used in systems and methods to construct arbitrary dynamically corrected gates that are implemented using realistic pulses with realizable magnitudes and rates of change.

In some examples, a U(1) subset can include rotations about an axis orthogonal to the noise term in a qubit Hamiltonian. Pulses which generate such rotations while canceling the noise to the first order correspond to the set of all closed curves lying in a two-dimensional plane. As a result, the pulse wave forms are precisely given by the curvature of these curves, a quantity which is very easy to compute. Moreover, plane curves that enclose zero net area yield pulses that cancel noise up to the second order. This method enables identification of the possible pulses that implement a desired dynamically corrected gate within this U(1) subset, and that it can be extended to suppress not only noise transverse to the pulse, but also noise in the pulse amplitude.

However, the present disclosure shows that there is a geometric structure hidden within the time-dependent Schrödinger equation that provides a direct way to identify all pulse wave forms that implement dynamically corrected gates spanning an entire SU(2) space of single-qubit operations subject to quasistatic noise. Any closed three-dimensional space curve corresponds to a qubit evolution operator in which the leading-order error vanishes, and the driving fields which implement this evolution can be read off or identified from the curve's curvature and torsion.

A relation between first-order robust evolution and closed curves can be shown based on general Lie-algebraic considerations, however, an explicit protocol that yields all dynamically corrected gates using this perspective has been lacking. Pulses which implement dynamical gate correction up to the second order can have one-to-one correspondence with closed curves whose projections onto three mutually orthogonal planes each enclose zero net area. A corresponding framework holds for higher-dimensional Hilbert spaces.

Figure 1:
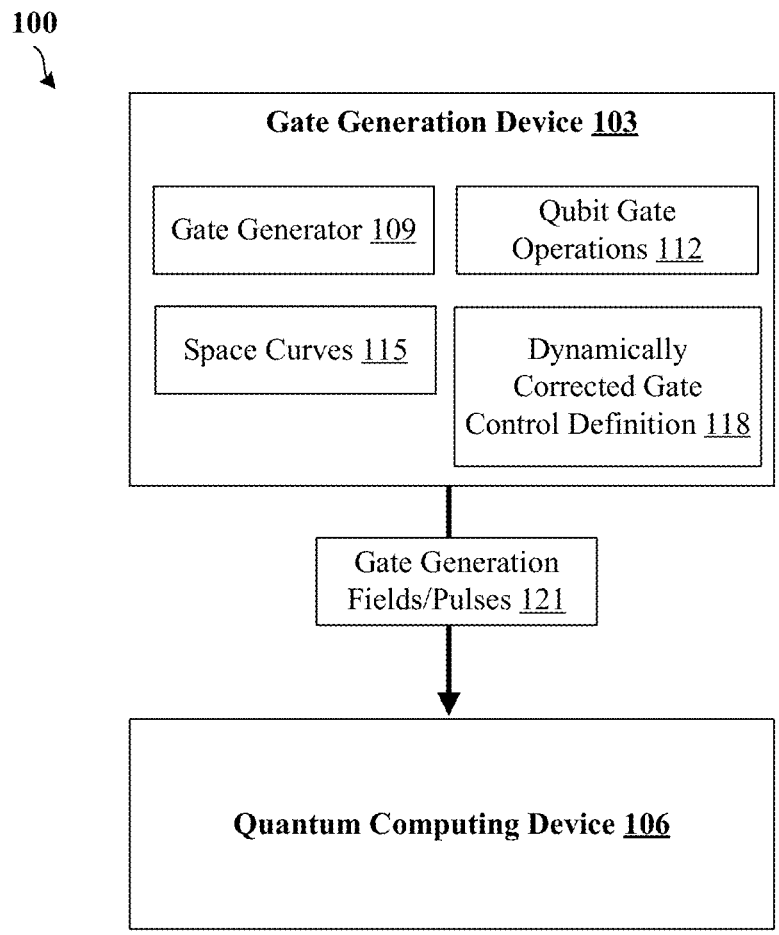
FIG. 1 illustrates an example of a quantum computing environment that includes a gate generation device and a quantum computing device, according to embodiments of the present disclosure.

Moving to the figures, FIG. 1 shows a quantum computing environment 100 that includes a gate generation device 103 and a quantum computing device 106. The gate generation device 103 can include a conventional computing system that includes at least one processor and at least one memory. The gate generation device 103 can also include server computers and other computing devices that can include cloud computing resources, grid computing resources, and other devices that are networked using a public or private network. A data store or memory of the gate generation device 103 can include a gate generator 109, qubit gate operations 112, space curves 115, and dynamically corrected gate control definitions 118.

The gate generator 109 can include instructions that generate closed space curves 115 that correspond to the qubit gate operations 112 as described further below. The gate generator 109 can then identify or generate dynamically corrected gate control definitions 118 using the space curves 115. For example, the driving fields which implement single qubit gate operations 112 can be read off or identified from the curvature and torsion of the space curves 115. Since the length of the space curve 115 can correspond to evolution time, the operation can be optimized by generating a set of different space curves 115 for a particular qubit gate operation 112, and selecting the space curve 115 that has a shortest length.

In addition, the gate generator 109 can include instructions that can identify user- or device-specified constraints on magnitude, and rate of change for gate generation fields or pulses 121. The gate generator 109 can generate the space curves 115 and dynamically corrected gate control definitions 118 that conform to the specified constraints. This can enable gate generation fields and pulses 121 with realizable magnitudes and rates of change based on the microwave and electromagnetic field generation devices being utilized by the quantum computing environment 100 and the quantum computing device 106.

An example qubit evolution identified by the gate generation device 103 can be described. A driven qubit subject to a single source of quasistatic noise can generally be described by the Hamiltonian of equation 1.

$$\mathcal{H}(t) = \mathcal{H}_0(t) + \delta\mathcal{H} \quad (1)$$
$$= \frac{\Omega(t)\cos\Phi(t)}{2}\sigma_x + \frac{\Omega(t)\sin\Phi(t)}{2}\sigma_y + \delta\beta\sigma_z$$

In equation 1, $\sigma_x$, $\sigma_y$, and $\sigma_z$ are Pauli matrices, and $\Omega(t)$ and $\Phi(t)$ determine two driving fields that are applied along orthogonal directions. $\delta H$ is the quasistatic noise term, which can be weak compared to the driving fields, $$\|\delta\mathcal{H}\| \ll \frac{1}{T}\int_0^T \Omega(t)\,dt,$$

where T is the duration of the gate. Noise can be slow compared to the pulse duration so that $\delta\beta$ is treated as a constant (but unknown) fluctuation parameter. While the noise term can lie along any direction depending on the type of system, it is sufficient to only consider the case where the noise is transverse to the driving field or pulse, as in equation 1, because we can always transform to a frame in which the Hamiltonian takes this form. For example, for a Hamiltonian given by $$\tilde{\mathcal{H}}(t) = \frac{\tilde{\Omega}_x(t)}{2}\sigma_x + \frac{\tilde{\Omega}_z(t)}{2}\sigma_z + \delta\beta\sigma_z,$$

the transformation operator that does this can be $$R(t) = \mathrm{diag}\left\{e^{\frac{1}{2}\int_0^t \tilde{\Omega}_z \tau dt}, e^{-\frac{1}{2}\int_0^t \tilde{\Omega}_z \tau dt}\right\}.$$

A Hamiltonian that has driving fields or pulses along all three axes can again be transformed into Equation 1 using a similar transformation operator. It can be convenient to transform the Hamiltonian according to equation 2.

$$\mathcal{H}_I(t) = U_0^\dagger(t)\sigma_z U_0(t)\delta\beta \quad (2)$$

$U_0(t)$ is the evolution operator associated with the original error-free Hamiltonian $\mathcal{H}_0(t)$, which can be generically parametrized according to equation set 3.

$$U_0(t) = \begin{pmatrix} u_1(t) & -u_2^*(t) \\ u_2(t) & u_1^*(t) \end{pmatrix} \quad (3)$$
$$u_1(t) = e^{\frac{1}{2}i(\theta(t)+\phi(t))}\cos\left(\frac{\chi(t)}{2}\right)$$
$$u_2(t) = -ie^{\frac{1}{2}i(\phi(t)-\theta(t))}\sin\left(\frac{\chi(t)}{2}\right)$$

Requiring $U_0(0)=1$ gives the initial conditions $\chi(0)=0$ and $\Phi(0)=-\theta(0)$. An explicit analytical solution cannot be obtained for even the error-free evolution $U_0(t)$ in the case of arbitrary driving fields $\Omega(t)$ and $\Phi(t)$ because of the intractability of the time-dependent Schrödinger equation. However, the mechanisms and techniques described herein are capable of obtaining the full solution space of dynamically corrected gates for this problem.

To obtain robust qubit operations, the evolution operator in the interaction picture can be the identity at the end of the evolution, $U_I(T)=1$. This in turn indicates that the evolution in the laboratory frame can equal the target gate to perform. The gate generator 109 can impose this constraint order by using a Magnus expansion for $U_I(T)$. The first two orders of the expansion involve the integrals of equation 4.

$$A_1(t) = \frac{1}{\delta\beta}\int_0^t \mathcal{H}_I(t_1)\,dt_1, \quad (4)$$
$$A_2(t) = \frac{1}{2\delta\beta^2}\int_0^t dt_1 \int_0^{t_1} dt_2[\mathcal{H}_I(t_1), \mathcal{H}_I(t_2)]$$

The gate generator 109 can impose $A_1(T)=0$ and $A_2(T)=0$, then the first- and second-order errors in the evolution vanish, respectively. Gate generator 109 can then find the driving fields $\Omega(t)$ and $\Phi(t)$ that satisfy these conditions to generate dynamically corrected gates.

The gate generator 109 can utilize the following geometrical framework. For example, the gate generator 109 can decompose $A_1(T)$ into Pauli matrices according to equation 5.

$$A_1(t) = r(t)\cdot\hat{\sigma} = x(t)\sigma_x + y(t)\sigma_y + z(t)\sigma_z \quad (5)$$

Here, the gate generator 109 can $r(t)=[x(t), y(t), z(t)]$ parametrize a curve in three-dimensional Euclidean space that starts at the origin at time $t=0$: $r(0)=(0, 0, 0)$. However, the gate generator 109 can also parametrize a curve in n-dimensional Hilbert space. Noticing from equations (2) and (4) that $[A'_1(t)]^2=1$, it follows that $\|r'(t)\|^2=1$, and thus $r(t)$ is the natural arc-length parametrization of the curve. This can also be seen by plugging equation 4 into the definition of $A_1(t)$ from equation 4, yielding equation (6).

$$r(t)=[-\sin\chi(t)\sin\phi(t),\ \sin\chi(t)\cos\phi(t),\ \cos\chi(t)] \quad (6)$$

Equation 4 can describe a vector of unit length. Although gate generator 109 can parametrize a space curve in infinitely many ways, $r(t)$ is special because for this parametrization, the length of the curve equals the evolution time. This enables the gate generator 109 to determine the shortest length curve and therefore the shortest evolution time for a dynamically corrected gate.

The definition of $r(t)$ shows that it measures the size of the first-order error in the evolution. However, the definition of $r(t)$ contains all the information about the evolution, not just the first-order error. To illustrate, the second-order derivative of A1 can be considered in equation 7.

$$\ddot{A}_1(t) = \dot{r}(t)\cdot\hat{\sigma} = \frac{1}{\delta\beta}\dot{\mathcal{H}}_I(t) = \frac{i}{\delta\beta}U_0^\dagger(t)[\mathcal{H}_0(t), \delta\mathcal{H}]U_0(t) \quad (7)$$

Using equation 1 along with this result, the gate generator 109 can obtain equation 8.

$$\|\ddot{A}_1(t)\|_F = \|\ddot{r}(t)\| = \frac{\|[\mathcal{H}_0(t), \delta\mathcal{H}]\|_F}{\delta\beta} = \Omega(t) \quad (8)$$

Here, $\|\cdot\|_F$ is the Frobenius norm, scaled by the inverse of the square root of the dimension of the matrix. Since $\Omega(t)$ is equal to the curvature of the curve $\|\ddot{r}(t)\|$, this is consistent with the earlier plane curve construction. Thus, given a space curve, the gate generator 109 can extract the corresponding driving field $\Omega(t)$ by computing the curvature.

The gate generator 109 can obtain the rest of the control Hamiltonian, namely, $\Phi(t)$, using the third-order derivative of $A_1(t)$. The gate generator 109 can differentiate equation 7 to determine equation 9.

$$\dddot{A}_1(t) = \dddot{r}(t) \cdot \hat{\sigma} = -\frac{1}{\delta\beta} U_0^\dagger(t) \mathcal{H}_0(t) [\mathcal{H}_0(t), \delta\mathcal{H}] U_0(t) + \frac{i}{\delta\beta} U_0^\dagger(t) [\mathcal{H}_0(t), \delta\mathcal{H}] \dot{U}_0(t) + \frac{1}{\delta\beta} U_0^\dagger(t) [\mathcal{H}_0(t), \delta\mathcal{H}] \mathcal{H}_0(t) U_0(t) \quad (9)$$

Equation 10 can then be identified using analogous expressions for the first and second order derivatives of $A_1(t)$.

$$-2i \frac{Tr\{\dot{A}_1(t)\ddot{A}_1(t)\dddot{A}_1(t)\}}{\|[\dot{A}_1(t), \ddot{A}_1(t)]\|_F^2} = \Phi \quad (10)$$

Using the fact that $$Tr\{\dot{A}_1(t)\ddot{A}_1(t)\dddot{A}_1(t)\} = \frac{1}{2} Tr\{[\dot{A}_1(t), \ddot{A}_1(t)]\dddot{A}_1(t)\},$$

in combination with the Pauli operator, the gate generator 109 can identify $Tr\{(a \cdot \hat{\sigma})(b \cdot \hat{\sigma})\} = 2a \cdot b$ and $[a \cdot \hat{\sigma}, b \cdot \hat{\sigma}] = 2i(a \times b) \cdot \hat{\sigma}$, and can determine that equation 10 can be utilized as the formula for torsion $\tau(t)$ of the curve as shown in equation 11.

$$\tau(t) = \frac{[\dot{r}(t) \times \ddot{r}(t)] \cdot \dddot{r}(t)}{\|\dot{r}(t) \times \ddot{r}(t)\|^2} = \Phi(t) \quad (11)$$

Thus, the gate generator 109 can obtain the full control Hamiltonian $H_0(t)$ from the space curve by computing its curvature and torsion. The integration constant obtained by integrating equation 11 to obtain $\Phi(t)$ can fix the initial phases in the target evolution operator. In other words, $\mathcal{H}_0(t) = i\dot{U}_0(t) U_0^\dagger(t) \Rightarrow \Omega(t) e^{-i\Phi(t)} = e^{i\theta(0)} \dot{\chi}(0) \Rightarrow \Phi(0) = -\theta(0) = \phi(0)$. Accordingly, this expression can by extracted from a closed space curve 115. Thus, the gate generator 109 can use space curves 115 to determine a full qubit evolution, not just its leading-order error. This is essentially a result of the Schrödinger equation for a two-level system corresponding exactly to an SU(2) representation of the Frenet-Serret equation for space curves.

The gate generator 109 can also cancel first order error. The space curves 115 can encode information about both the ideal evolution and the error. This a powerful tool that can be used by the gate generator 109 in order to define dynamically corrected gates or generate dynamically corrected gate control definitions 118. To ensure that the leading-order error vanishes at the end of the evolution, the gate generator 109 can impose $r(T) = 0$. In other words, the space curves 115 can be selected and deigned to form a closed loop. Once a closed space curve 115 is identified, gate generator 109 can identify or read off the control fields that perform the noise cancellation from its curvature and torsion. The gate generator 109 can then simultaneously fix $U_0(T)$ to the desired target gate without solving the time-dependent Schrödinger equation.

As shown in equation 6, gate generator 109 can determine $\Phi(T)$ and $\chi(T)$ using the tangent vector of the curve at the final time $r'(T)$. The remaining angle in the target evolution can be determined from the total torsion (the integral of torsion along the curve) of equation 12.

$$\theta(T) - \theta(0) = -\int_0^T \tau(t)dt - \arg[-i\dot{x}(t)\dot{y}(t) + i\dot{x}(t)\dot{y}(t) + \dot{z}(t)]\big|_0^T \quad (12)$$

This expression can be obtained by equating the arguments of the off-diagonal components of the matrices $\mathcal{H}_0(t)$ and $i\dot{U}_0(t) U_0^\dagger(t)$. The resulting equation is seen to be equivalent to Eq. (12) if the derivatives of the Cartesian coordinates are rewritten in terms of $\Phi$ and $\chi$ using equation 6. Since the Hamiltonian only depends on local properties of the curve (namely, its curvature and torsion), it follows that the corresponding evolution operator will remain invariant under rigid rotations and translations of the curve. Thus, the orientation of the final tangent vector relative to the initial one determines the final evolution operator (along with the total torsion), rather than its orientation with respect to fixed coordinate axes.

Figure 2:
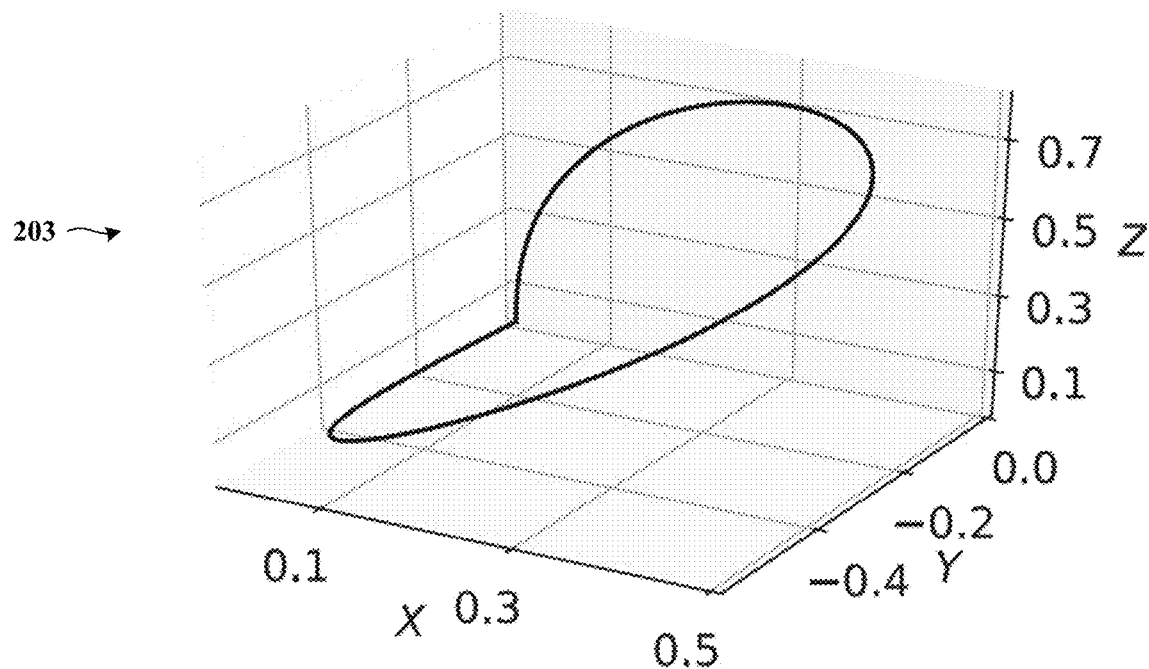
FIG. 2 illustrates an example of a closed space curve and corresponding gate generation pulses generated using the quantum computing environment of FIG. 1, according to embodiments of the present disclosure.
Figure 2:
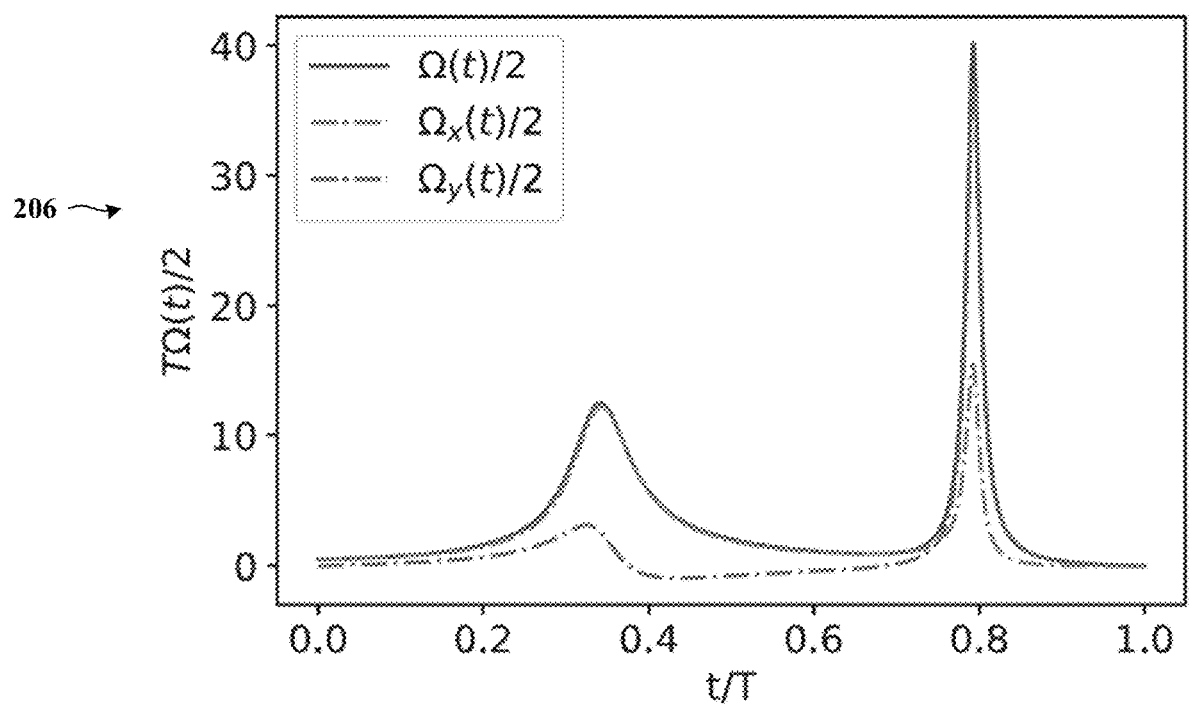

FIG. 2 shows a graph 203 that includes an example of a closed space curve 115 and a graph 206 that includes gate generation pulses 121 for the closed space curve 115. One example of how this geometrical structure can be exploited to design dynamically corrected gates, let us take the target gate operation to be one of the Clifford gates, $U_0(T) = R(-\hat{x}+\hat{y}+\hat{z}, 2\pi/3)$, or rotation about the axis $-\hat{x}+\hat{y}+\hat{z}$ by angle $2\pi/3$. To obtain a gate generation pulse 121 that generates this qubit gate operation 112 while canceling first-order errors, a closed curve is constructed with the appropriate slope as it returns to the origin, as shown in graph 203. The gate generation control fields or pulses 121 can be extracted from the curvature and torsion.

In graph 203, the curve is constructed as $r(l) = (1-l)r_1(l) + lr_2(l)$, where $r1(l) = \sqrt{2} \sin(\pi l)[0, \sin 2(\pi l/2), \cos^2(\pi l/2)]$ and $r_2(l) = \sqrt{2} \sin(\pi l)[\sin^2(\pi l/2), \cos^2(\pi l/2), 0]$ Rz (q), and where l ranges from 0 to 1. Rz (q) is the rotation matrix around the z axis for angle q. Changing q deforms the curve but does not alter the relative orientation of the initial and final tangent vectors, and thus does not alter the final values of $\chi$ and $\Phi$. Tuning q does, however, alter the final value of $\theta$. The parameter $q = 1.6054$ achieves the desired value in this example. Graph 206 shows the pulse shape. Here, $\Omega_x = \Omega \cos \Phi$, $\Omega_y = \Omega \sin \Phi$.

Figure 3:
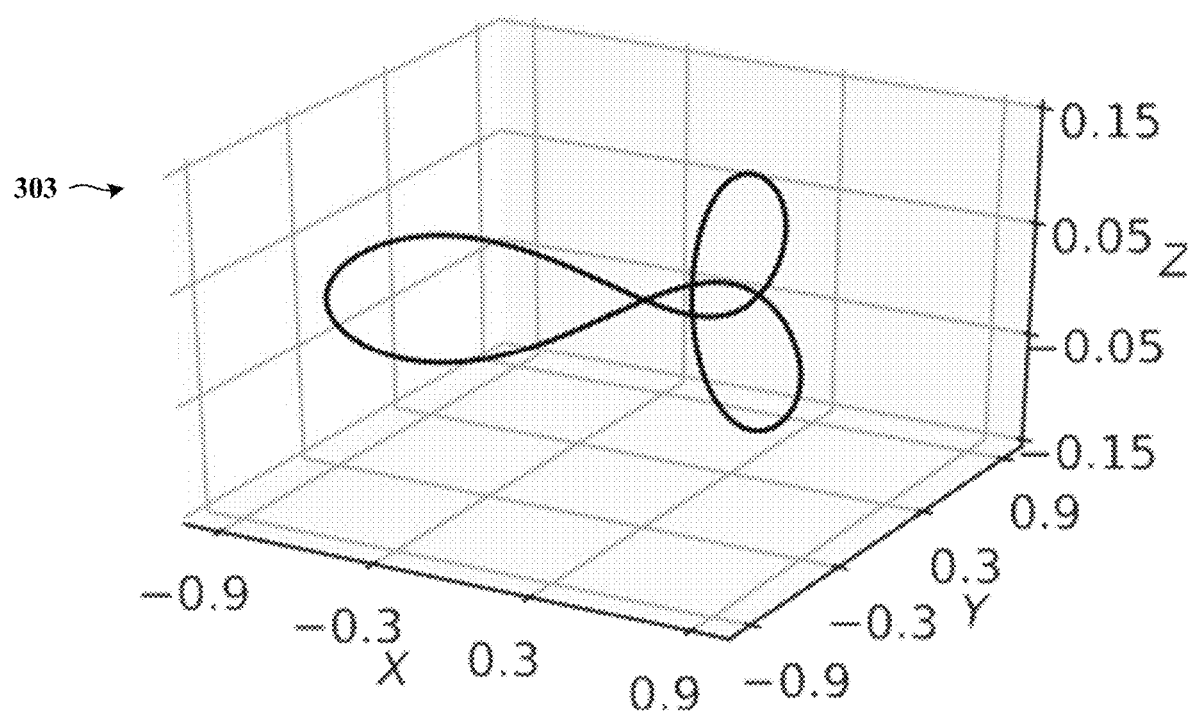
FIG. 3 illustrates an example of a closed space curve robust to the first order, along with corresponding gate generation pulses generated using the quantum computing environment of FIG. 1, according to embodiments of the present disclosure.
Figure 3:
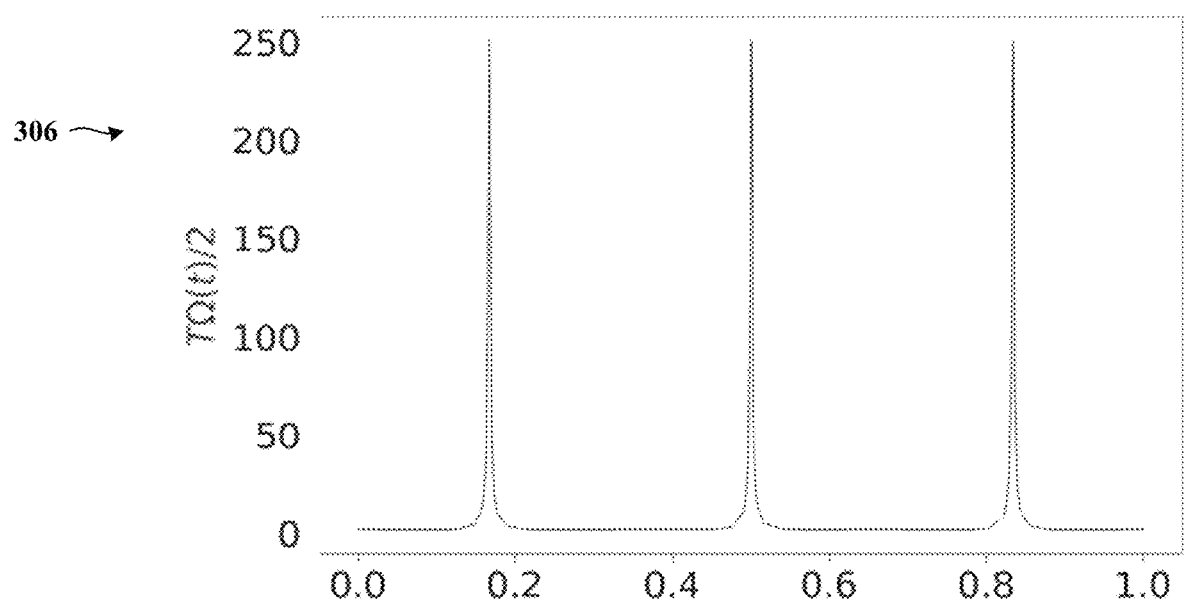

FIG. 3 shows a graph 303 that includes an example of a closed space curve 115 and a graph 306 that includes gate generation pulses 121 for the closed space curve 115. The space curve 115 in graph 303 can be a space curve 115 that is parameterized by y. This space curve can be robust to the first order.

In some examples, there is only one control field in the Hamiltonian, say, along $\sigma_x$, while there is a constant detuning or drift parameter which is noisy, so that the Hamiltonian has the form $\mathcal{H}(t) = \Omega(t)\sigma_x + (\Delta + \delta\beta)\sigma_z$, as shown in graph 303. This is a single-qubit identity gate that is robust to the first order. In order to cancel the noise errors, the gate generator 109 can identify closed space curves 115 that have constant torsion. For example, $\alpha$ can be a closed space curve 115 lying on a unit sphere which can be parametrized according to equation set 13.

$$\alpha(\lambda) = [x_\alpha(\lambda), y_\alpha(\lambda), z_\alpha(\lambda)], \text{ where} \quad (13)$$

$$x_\alpha(\lambda) = \frac{1}{4}[\sqrt{2}\cos(2\lambda) - 2\cos(\lambda)],$$

$$y_\alpha(\lambda) = \frac{1}{4}[-\sqrt{2}\sin(2\lambda) - 2\sin(\lambda)],$$

$$z_\alpha(\lambda) = \frac{1}{2}\sqrt{\sqrt{2}\cos(3\lambda) + \frac{5}{2}}.$$

In equation 13, $\lambda \in [0, 2\pi)$. A closed curve with constant torsion can be identified as $\gamma(\lambda) = \int \alpha(\mu) \times \alpha'(\mu) d\mu$. The curve $\alpha$ is an example of the spherical curve formulation to treat the dynamically corrected gate problem for Hamiltonians with a constant detuning parameter. More generally, the curves in that formulation correspond to the binormal indicatrix of a three-dimensional space curve $\gamma$. Thus, the two formulations can be equivalent in the case of constant torsion. However, the gate generator 109 can utilize a simple geometrical interpretation of the error-cancellation condition, which is effective not only for first-order cancellation but also second order.

Figure 4:
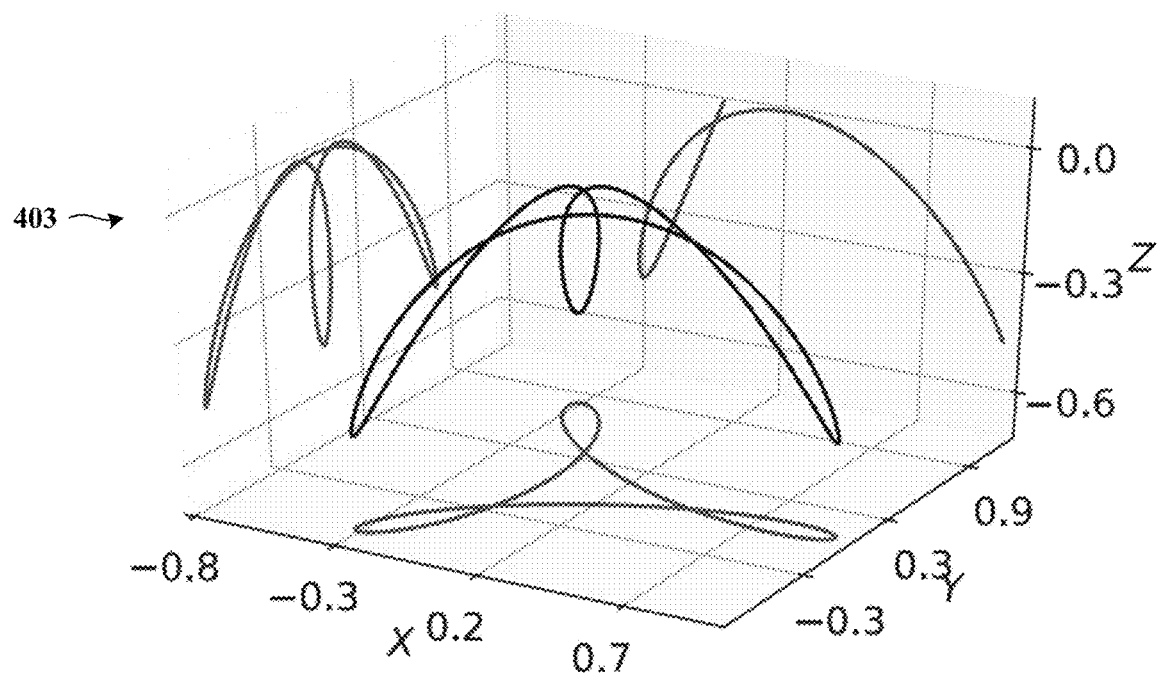
FIG. 4 illustrates an example of a closed space curve robust to the second order, along with corresponding gate generation pulses generated using the quantum computing environment of FIG. 1, according to embodiments of the present disclosure.
Figure 4:
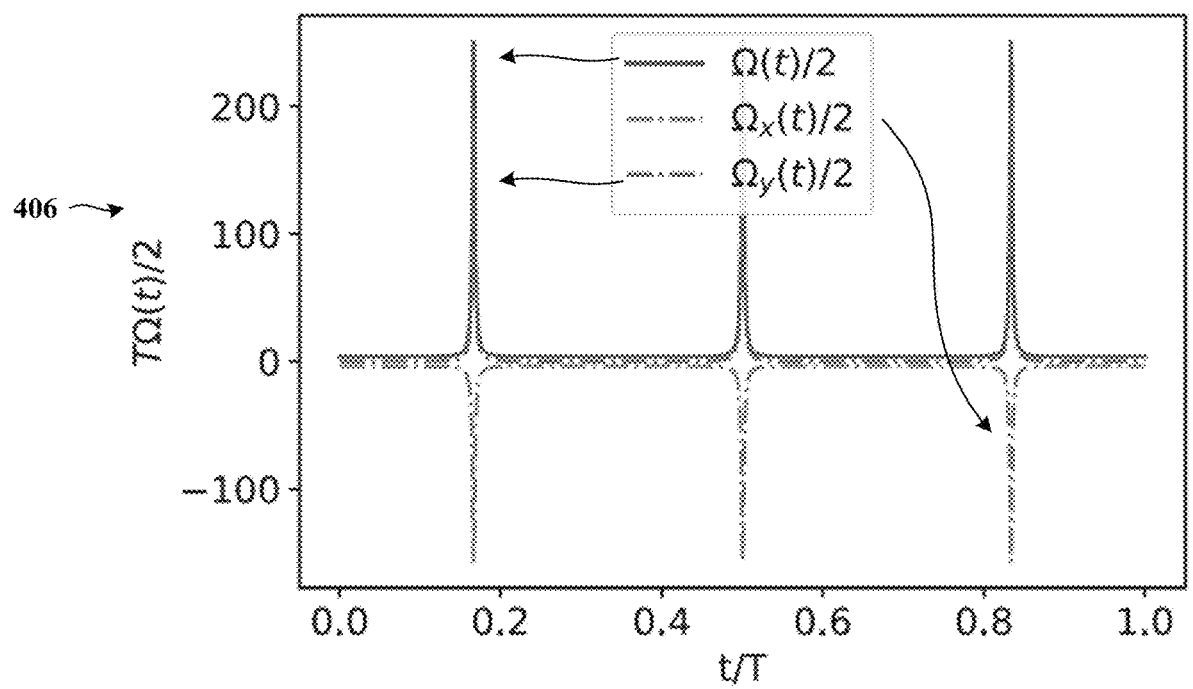

FIG. 4 shows a graph 403 that includes an example of a closed space curve 115 and a graph 406 that includes gate generation pulses 121 for the closed space curve 115. The space curve 115 in graph 403 can correspond to a qubit identity gate robust to the second order. Second-order dynamically corrected gates correspond to closed curves with vanishing-area or zero area planar projections. The graph 403 shows the space curve 115 as well as its projections onto the xy, yz, and xz planes. All three projected curves have zero enclosed area. The graph 406 shows gate generation pulses 121 obtained from the curvature and torsion of the space curve 115 in graph 403. Here, $\Omega_x = \Omega \cos \Phi$, $\Omega_y = \Omega \sin \Phi$.

For second-order error cancellation, $A_2(T)$ can be set equal to 0. To find the curves (and hence pulses) that achieve this, $A_2$ can be considered as $A_2(t) = -iR2(t) \cdot \vec{\sigma}$, where $R2(t) = r(t_1) \times r(t_1) dt_1$, as obtained using equations 4 and 5. The constraint on error cancellation then becomes $R_2(T) = [R_{2x}(T), R_{2y}(T), R_{2z}(T)] = 0$. When the first-order error-cancellation constraint is satisfied [r(T)=0], $R_{2x}(T)$, $R_{2y}(T)$, and $R_{2z}(T)$ are proportional to the areas enclosed by the closed curve projected onto the yz, zx, and xy planes. The sign of the area can be determined by the direction of the winding of the curve. Accordingly, the gate generator 109 can generate a space curve 115 for a single qubit gate operation 112 using these constraints in order to generate a single qubit identity gate robust to the second order.

Because the curve $\alpha$ defined in equation 13 satisfies the constraint R2(T)=0, this curve can be used to generate an example of a driving pulse that cancels second-order error. The curve $\alpha$ and its projections onto the xy, xz, and yz planes are shown in graph 403. All three projected plane curves have zero enclosed area. As a result, the pulse shape extracted from this curve and shown in graph 406 performs a robust identity operation.

Figure 5:
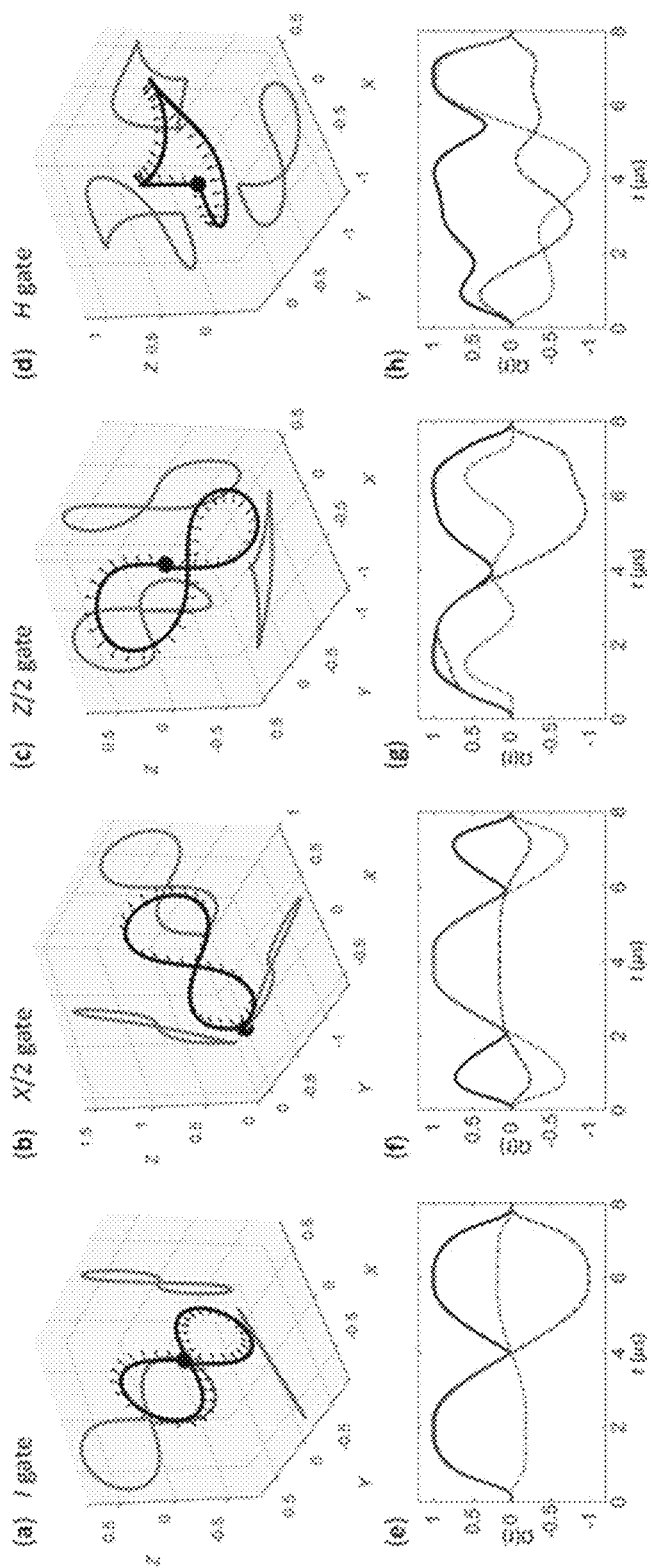
FIG. 5 illustrates examples of various closed space curves and corresponding gate generation pulses for various different gates, according to embodiments of the present disclosure.

FIG. 5 shows graphs of various closed space curves 115 and corresponding gate generation pulses 121 for various different gates. The graphs include (a) an identity operation (I gate), (b) a $\pi/2$ rotation about x (X/2 gate), (c) a $\pi/2$ rotation about z (Z/2 gate), and (d) a Hadamard operation (H gate). Corresponding pulses 121 are shown in graphs (e)-(h). These pulses 121 are designed to implement these four different single-qubit gates. These pulses 121 can be four different microwave or electromagnetic pulses implemented or generated using a microwave generation device or an electromagnetic field generation device as can be appreciated.

In addition to facilitating the design of globally optimal control pulses, the gate generator 109 can also use the geometrical framework to extract information about the noise-cancellation properties of pulses obtained in other ways, for example, by using numerical algorithms such as gradient ascent pulse engineering (GRAPE). Pulses that can implement high-fidelity single qubit gates on silicon quantum dot spin qubits can be analyzed using GRAPE. In some cases, the GRAPE algorithm can be implemented with gate fidelity as the cost function and with a noise level corresponding to $\sqrt{(\delta\beta^2)}=16.7$ kHz, which can be attributed to nuclear spin noise.

Gate generator 109 can also impose constraints on the pulse bandwidth through filtering, where the pulses are strongly smoothed out and forced to approach zero at the beginning and end of the gate. In FIG. 5, arrows are shown along each of the space curves 115 to indicate the value of the evolution operator phase $\theta(t)$ as the system evolves. The value of this phase at the final time $\theta(T)$ distinguishes between some of the gates, for example, the I and Z/2 gates. Note that if we were to include a third driving field $\Omega_z(t)$, then this can provide direct control over the phase $\theta(t)$. The I gate in (a) has $\theta(T)=0$, while the Z/2 gate in (c) has $\theta(T)=\pi/2$. In (e)-(h), the dashed curves are $\Omega_x(t)/2$ and $\Omega_y(t)/2$, while the solid curve is the total magnitude of the pulse envelope.

In each case, the corresponding space curve is closed or substantially closed, showing that the first-order error-cancellation constraint is almost perfectly satisfied. Moreover, the two-dimensional projections of the curves form figure-eight shapes in most cases, showing that the second-order cancellation constraint is nearly satisfied as well. These pulses are four to five times longer than the typical timescale of a $\pi$ pulse, which can be 1.75 µs. This is apparent from the space curve, where the bandwidth constraints require pulse durations on the order of 8 µs in order for the planar projections of the curves to complete their respective figure eights and thus suppress second-order noise.

While the present disclosure has been focused on and discussed with reference to two-dimensional Hilbert spaces, the gate generator 109 can also utilize a generalization to higher dimensional systems. This can be done by decomposing A1(t) into tensor products of Pauli matrices. For example, for a two-qubit system, this will lead to a mapping between robust pulses and closed curves in a 15-dimensional space. The higher-dimensional form of the Frenet-Serret equations can relate the generalizations of curvature and torsion for these curves to driving fields in the two-qubit Hamiltonian.

Figure 6:
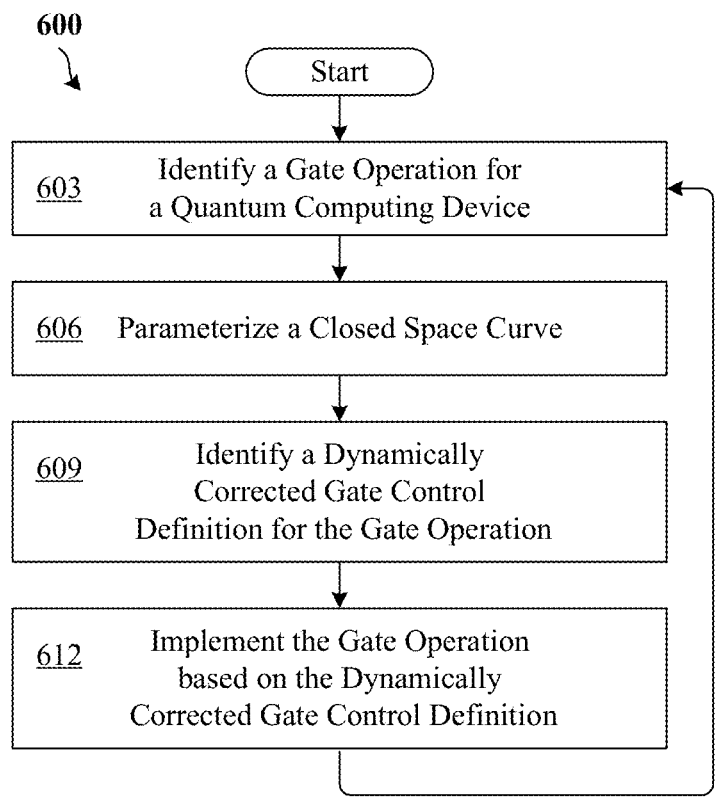
FIG. 6 illustrates a flowchart of functionalities performed by components of the quantum computing environment of FIG. 1, according to embodiments of the present disclosure.

FIG. 6 shows a flowchart 600 that describes functionalities performed by components of the quantum computing environment 100. While the steps are generally described as performed by the gate generator 109, other components of the quantum computing environment 100 are involved and can aspects of the flowchart 600.

In step 603, the gate generator 109 can identify a qubit gate operation 112 for a quantum computing device 106. This can include the gate generator 109 identifying an evolution operator associated with a target gate operation 112 for a quantum computing device 106. In some cases, the gate generator 109 can also identify pulse or field constraints for magnitude, rate of change, and other constraints based on hardware, efficiency, consistency, or arbitrary limitations.

In step 606, the gate generator 109 can parameterize a closed space curve 115. Any closed three-dimensional space curve 115 corresponds to a qubit evolution operator in which the leading-order error vanishes. In order to cancel the noise errors, the gate generator 109 can identify closed space curves 115 that have constant torsion. In order to achieve second-order dynamically corrected gates, the gate generator 109 can generate closed space curves 115 with vanishing-area or zero area planar projections. Since the length of the space curve 115 can correspond to evolution time, the gate generator 109 can optimize the target gate operation 112 by generating or identifying a set of different space curves 115 for a particular qubit gate operation 112, and selecting the space curve 115 that has a shortest length.

In step 609, the gate generator 109 can identify a dynamically corrected gate control definition 118 for the qubit gate operation 112. The driving fields and/or pulses 121 which implement the evolution for the qubit gate operation 112 can be read off or identified from the curvature and torsion of the space curve 115.

In step 612, the gate generator 109 can implement the qubit gate operation 112 based on the dynamically corrected gate control definition 118. For example, the gate generation device 103 can provide or effect the gate generation pulses 121 in conjunction with the quantum computing device 106. The pulses 121 can be implemented or generated using a microwave generation device or an electromagnetic field generation device that is a component of one or more of the gate generation devices 103 and the quantum computing device 106.

Although flowcharts can show a specific order of execution, it is understood that the order of execution can differ from that which is depicted. For example, the order of execution of two or more blocks can be scrambled relative to the order shown. The flowcharts can be viewed as depicting an example of a method implemented by a computing device. The flowchart can also be viewed as depicting an example of instructions executed in a computing device. Also, two or more blocks shown in succession can be executed concurrently or with partial concurrence. Further, in some embodiments, one or more of the blocks shown can be skipped or omitted. In addition, any number of counters, state variables, semaphores, or warning messages might be added to the logical flow described herein, for purposes of enhanced utility, accounting, performance measurement, or providing troubleshooting aids, etc. It is understood that all such variations are within the scope of the present disclosure.

Although the functionalities, services, programs, and computer instructions described herein can be embodied in software or code executed by general purpose hardware as discussed above, as an alternative the same can also be embodied in dedicated hardware or a combination of software/general purpose hardware and dedicated hardware. If embodied in dedicated hardware, each can be implemented as a circuit or state machine that employs any one of or a combination of a number of technologies. These technologies can include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc. Such technologies are generally well known by those skilled in the art and, consequently, are not described in detail herein.

Also, the functionalities described herein that include software or code instructions can be embodied in any non-transitory computer-readable medium, which can include any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium can be a random access memory (RAM) including, for example, static random access memory (SRAM) and dynamic random access memory (DRAM), or magnetic random access memory (MRAM). In addition, the computer-readable medium can be a read-only memory (ROM), a programmable read-only memory (PROM), an erasable programmable read-only memory (EPROM), an electrically erasable programmable read-only memory (EEPROM), or other type of memory device.

Further, any logic or functionality described herein can be implemented and structured in a variety of ways. For example, one or more applications described can be implemented as modules or components of a single application or set of instructions. Further, one or more instructions described herein can be executed in shared or separate computing devices or a combination thereof.

The disclosure describes a number of aspects that include but are not limited to the following aspects that are numbered for reference purposes. Aspect 1 describes a computer-implemented method, comprising: identifying an evolution operator associated with a target gate operation for a quantum computing device; determining a parameterization of a space curve based at least in part on a Magnus expansion of the evolution operator; extracting at least one control field for a time-dependent Hamiltonian associated with the target gate operation based at least in part on at least one derivative of the Magnus expansion of the evolution operator; and implementing at least one dynamically corrected gate comprising the target gate operation for the quantum computing device based at least in part on the at least one control field. Aspect 2 describes the computer-implemented method of aspect 1, further comprising: extracting a first control field for the time-dependent Hamiltonian associated with the target gate operation based at least in part on a curvature of a second-order derivative of a first-order Magnus expansion of the evolution operator; and extracting a second control field for the time-dependent Hamiltonian associated with the target gate operation based at least in part on a torsion of a third-order derivative of the first-order Magnus expansion of the evolution operator. Aspect 3 describes the computer-implemented method of aspect 1 or 2, wherein the space curve is parameterized in three-dimensional Euclidean space. Aspect 4 describes the computer-implemented method of any one of aspects 1-3, wherein the Magnus expansion of the evolution operator is decomposed into Pauli matrices to parameterize the space curve in three-dimensional Euclidean space. Aspect 5 describes the computer-implemented method of any one of aspects 1-4, wherein the target gate operation comprises a single-qubit gate. Aspect 6 describes the computer-implemented method of any one of aspects 1-5, further comprising: identifying the space curve for noise cancellation based at least in part on a requirement for the space curve to form a closed loop. Aspect 7 describes the computer-implemented method of any one of aspects 1-6, further comprising: identifying the space curve for second-order noise cancellation based at least in part on a requirement for planar projections of the space curve to comprise zero enclosed area. Aspect 8 describes the computer-implemented method of any one of aspects 1-7, further comprising: determining an angle of the evolution operator based on a total torsion along the space curve. Aspect 9 describes the computer-implemented method of any one of aspects 1-8, wherein a length of the space curve is equivalent to an evolution time of the space curve. Aspect 10 describes the computer-implemented method of any one of aspects 1-9, wherein the parameterization is a natural arc-length parameterization. Aspect 11 describes the computer-implemented method of any one of aspects 1-10, wherein planar projections of the space curve onto at least one two-dimensional plane comprise zero enclosed area.

Aspect 12 describes a system for quantum computing, the system comprising: at least one computing device; and at least one memory comprising executable instructions that cause the at least one computing device to at least: identify an evolution operator associated with a target gate operation for a quantum computing device; parameterize a space curve based at least in part on a Magnus expansion of the evolution operator; extract at least one control field for a time-dependent Hamiltonian associated with the target gate operation based at least in part on at least one derivative of the Magnus expansion of the evolution operator; and implement the target gate operation for the quantum computing device based at least in part on the at least one control field. Aspect 13 describes the system of aspect 12, wherein the Magnus expansion of the evolution operator is decomposed into tensor products of Pauli matrices. Aspect 14 describes the system of aspect 12 or 13, wherein the space curve is parameterized for n-dimensional Hilbert space. Aspect 15 describes the system of any one of aspects 12-14, wherein the target gate operation comprises a two-qubit gate. Aspect 16 describes the system of any one of aspects 12-15, wherein a length of the space curve is equivalent to an evolution time of the space curve. Aspect 17 describes the system of any one of aspects 12-16, wherein the parameterization is a natural arc-length parameterization.

Aspect 18 describes a computer-implemented method, comprising: parameterizing a closed space curve for a target gate operation for a quantum computing device, wherein the closed space curve corresponds to an evolution operator of a time-dependent Schrödinger equation associated with the target gate operation; identifying at least one control field for the target gate operation based at least in part on a geometrical analysis of the evolution operator of the time-dependent Schrödinger equation; and implementing the target gate operation for the quantum computing device based at least in part on the at least one control field. Aspect 19 describes the computer-implemented method of aspect 18, wherein the geometrical analysis comprises identification of a torsion and a curvature of the closed space curve. Aspect 20 describes the computer-implemented method of aspect 18 or 19, wherein the geometrical analysis comprises at least one derivative of a Magnus expansion of the evolution operator.

The above-described examples of the present disclosure are merely possible examples of implementations set forth for a clear understanding of the principles of the disclosure. While aspects and figures are provided for clarity of discussion, it is understood that the concepts described with respect to a particular figure, aspect, or context can be utilized and combined with the concepts described with respect to the other figures, aspects, and contexts. These variations and modifications can be made without departing substantially from the disclosure. All such modifications and variations are intended to be included herein within the scope of this disclosure and protected by the following claims.

Therefore, the following is claimed:

1. A computer-implemented method, comprising:
   identifying an evolution operator associated with a target gate operation for a quantum computing device;
   determining a parameterization of a space curve based at least in part on a Magnus expansion of the evolution operator;
   extracting at least one control field for a time-dependent Hamiltonian associated with the target gate operation based at least in part on at least one derivative of the Magnus expansion of the evolution operator; and
   implementing at least one dynamically corrected gate comprising the target gate operation for the quantum computing device based at least in part on the at least one control field.

2. The computer-implemented method of claim 1, further comprising:
   extracting a first control field for the time-dependent Hamiltonian associated with the target gate operation based at least in part on a curvature of a second-order derivative of a first-order Magnus expansion of the evolution operator; and
   extracting a second control field for the time-dependent Hamiltonian associated with the target gate operation based at least in part on a torsion of a third-order derivative of the first-order Magnus expansion of the evolution operator.

3. The computer-implemented method of claim 1, wherein the space curve is parameterized in three-dimensional Euclidean space.

4. The computer-implemented method of claim 1, wherein the Magnus expansion of the evolution operator is decomposed into Pauli matrices to parameterize the space curve in three-dimensional Euclidean space.

5. The computer-implemented method of claim 1, wherein the target gate operation comprises a single-qubit gate.

6. The computer-implemented method of claim 1, further comprising:
   identifying the space curve for noise cancellation based at least in part on a requirement for the space curve to form a closed loop.

7. The computer-implemented method of claim 1, further comprising:
   identifying the space curve for second-order noise cancellation based at least in part on a requirement for planar projections of the space curve to comprise zero enclosed area.

8. The computer-implemented method of claim 7, wherein planar projections of the space curve onto at least one two-dimensional plane comprise zero enclosed area.

9. The computer-implemented method of claim 1, further comprising:
   determining an angle of the evolution operator based on a total torsion along the space curve.

10. The computer-implemented method of claim 1, wherein a length of the space curve is equivalent to an evolution time of the space curve.

11. The computer-implemented method of claim 1, wherein the parameterization is a natural arc-length parameterization.

12. A system for quantum computing, the system comprising:
- at least one computing device; and
- at least one memory comprising executable instructions that cause the at least one computing device to at least:
  - identify an evolution operator associated with a target gate operation for a quantum computing device;
  - parameterize a space curve based at least in part on a Magnus expansion of the evolution operator;
  - extract at least one control field for a time-dependent Hamiltonian associated with the target gate operation based at least in part on at least one derivative of the Magnus expansion of the evolution operator; and
  - implement the target gate operation for the quantum computing device based at least in part on the at least one control field.

13. The system of claim 12, wherein the Magnus expansion of the evolution operator is decomposed into tensor products of Pauli matrices.

14. The system of claim 12, wherein the space curve is parameterized for n-dimensional Hilbert space.

15. The system of claim 12, wherein the target gate operation comprises a two-qubit gate.

16. The system of claim 12, wherein a length of the space curve is equivalent to an evolution time of the space curve.

17. The system of claim 12, wherein the parameterization is a natural arc-length parameterization.

18. A computer-implemented method, comprising:
- parameterizing a closed space curve for a target gate operation for a quantum computing device, wherein the closed space curve corresponds to an evolution operator of a time-dependent Schrödinger equation associated with the target gate operation;
- identifying at least one control field for the target gate operation based at least in part on a geometrical analysis of the evolution operator of the time-dependent Schrödinger equation; and
- implementing the target gate operation for the quantum computing device based at least in part on the at least one control field.

19. The computer-implemented method of claim 18, wherein the geometrical analysis comprises identification of a torsion and a curvature of the closed space curve.

20. The computer-implemented method of claim 18, wherein the geometrical analysis comprises at least one derivative of a Magnus expansion of the evolution operator.

* * * * *